(12) United States Patent
Belousov et al.

(10) Patent No.: US 9,139,897 B2
(45) Date of Patent: Sep. 22, 2015

(54) THERMAL BARRIER COATINGS AND METHODS OF APPLICATION

(75) Inventors: Igor V. Belousov, Kyiv (UA); Yuriy G. Kononenko, Kyiv (UA); Vadim I. Bondarchuk, Kiev (UA); Anatoly Kuzmichev, Kiev (UA); John F. Mullooly, Jr., Oklahoma City, OK (US)

(73) Assignee: United Technologies Corporation, Hartford, CT (US)

( * ) Notice: Subject to any disclaimer, the term of this patent is extended or adjusted under 35 U.S.C. 154(b) by 1007 days.

(21) Appl. No.: 12/981,661

(22) Filed: Dec. 30, 2010

(65) Prior Publication Data

US 2012/0167573 A1 Jul. 5, 2012

(51) Int. Cl.

| | |
|---|---|
| *B63H 1/26* | (2006.01) |
| *B63H 7/02* | (2006.01) |
| *B64C 11/24* | (2006.01) |
| *B64C 27/46* | (2006.01) |
| *F01D 5/18* | (2006.01) |
| *F03B 3/12* | (2006.01) |
| *F03B 7/00* | (2006.01) |
| *F03D 11/02* | (2006.01) |
| *F04D 29/38* | (2006.01) |
| *B64C 11/16* | (2006.01) |
| *F01D 5/14* | (2006.01) |
| *C23C 14/08* | (2006.01) |

(Continued)

(52) U.S. Cl.
CPC .............. *C23C 14/083* (2013.01); *C23C 14/226* (2013.01); *C23C 28/321* (2013.01); *C23C 28/325* (2013.01); *C23C 28/3215* (2013.01); *C23C 28/345* (2013.01); *C23C 28/3455* (2013.01); *Y10T 428/24058* (2015.01); *Y10T 428/2495* (2015.01); *Y10T 428/264* (2015.01)

(58) Field of Classification Search
CPC ........... F01D 5/288; F01D 5/28; F01D 5/286; F05B 2230/90
USPC ......... 60/752–760; 415/115, 116; 416/241 R, 416/241 B; 428/105, 336, 213; 427/248.1, 427/596, 523

See application file for complete search history.

(56) References Cited

U.S. PATENT DOCUMENTS

| | | |
|---|---|---|
| 4,405,659 A | 9/1983 | Strangman |
| 5,660,885 A | 8/1997 | Hasz et al. |
| 5,871,820 A | 2/1999 | Hasz et al. |

(Continued)

FOREIGN PATENT DOCUMENTS

| | | |
|---|---|---|
| EP | 0940480 A1 | 9/1999 |
| EP | 1640473 A1 | 3/2006 |

OTHER PUBLICATIONS

European Search Report for EP Patent Application No. 11195328, dated Feb. 24, 2012.

(Continued)

*Primary Examiner* — Craig Kim
(74) *Attorney, Agent, or Firm* — Bachman & LaPointe, P.C.

(57) ABSTRACT

A coated part is exposed to a gas flow. The gas flow has a characteristic gas flow direction distribution over a surface of the coated part. The coated part has a substrate having a substrate surface and a coating over the substrate surface. The coating comprises at least one coating layer. A first such layer is columnar and has a column boundary direction distribution. The column boundary direction distribution is selected for partial local alignment with the gas flow direction distribution.

20 Claims, 2 Drawing Sheets

(51) Int. Cl.
*C23C 14/22* (2006.01)
*C23C 28/00* (2006.01)

(56) References Cited

U.S. PATENT DOCUMENTS

| | | | |
|---|---|---|---|
| 5,876,860 A | 3/1999 | Marijnissen et al. | |
| 5,914,189 A | 6/1999 | Hasz et al. | |
| 6,060,177 A | 5/2000 | Bornstein et al. | |
| 6,465,090 B1 | 10/2002 | Stowell et al. | |
| 6,471,881 B1 * | 10/2002 | Chai et al. | 216/39 |
| 6,627,323 B2 | 9/2003 | Williams et al. | |
| 6,703,137 B2 * | 3/2004 | Subramanian | 428/469 |
| 6,720,038 B2 | 4/2004 | Darolia et al. | |
| 7,226,668 B2 | 6/2007 | Nagaraj et al. | |
| 7,318,955 B2 | 1/2008 | Darolia et al. | |
| 7,416,788 B2 | 8/2008 | Floyd et al. | |
| 7,785,722 B2 | 8/2010 | Freling et al. | |
| 2005/0244663 A1 * | 11/2005 | Ulion et al. | 428/472 |
| 2006/0016191 A1 * | 1/2006 | Woodcock et al. | 60/754 |
| 2007/0116883 A1 | 5/2007 | Gorman et al. | |
| 2008/0317998 A1 | 12/2008 | Eichmann et al. | |
| 2009/0110903 A1 | 4/2009 | Margolies | |
| 2009/0169752 A1 | 7/2009 | Fu et al. | |
| 2009/0169914 A1 | 7/2009 | Fu et al. | |
| 2009/0186237 A1 | 7/2009 | Lee | |
| 2009/0324989 A1 | 12/2009 | Witz et al. | |
| 2010/0028128 A1 * | 2/2010 | Fischer | 415/1 |
| 2011/0052406 A1 * | 3/2011 | Bruce et al. | 416/241 R |

OTHER PUBLICATIONS

Aysegul Aygun et al., Novel Thermal Barrier Coatings that are Resistant to High-Temperature Attack by Glassy Deposits, Elsevier Ltd., 2007, pp. 6734-6745.

S. Gu et al., Thermal Conductivity of Zirconia Coatings with Zig-Zag Pore Microstructures, Elsevier Science Ltd., 2001, pp. 2539-2547.

D.D. Hass et al., Low Thermal Conductivity Vapor Deposited Zirconia Microstructures, Elsevier Science Ltd., 2001, pp. 973-983.

* cited by examiner

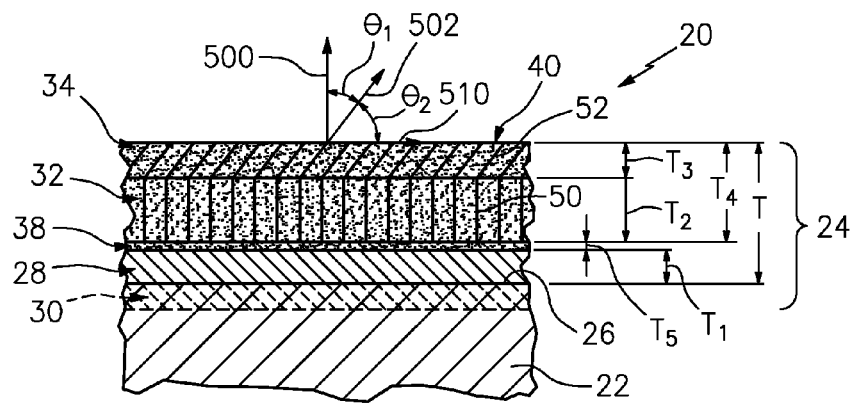
*FIG. 1*
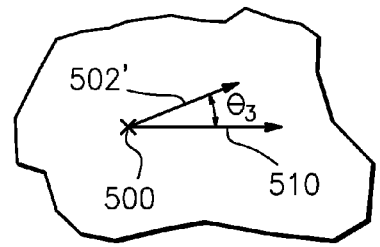
*FIG. 2*
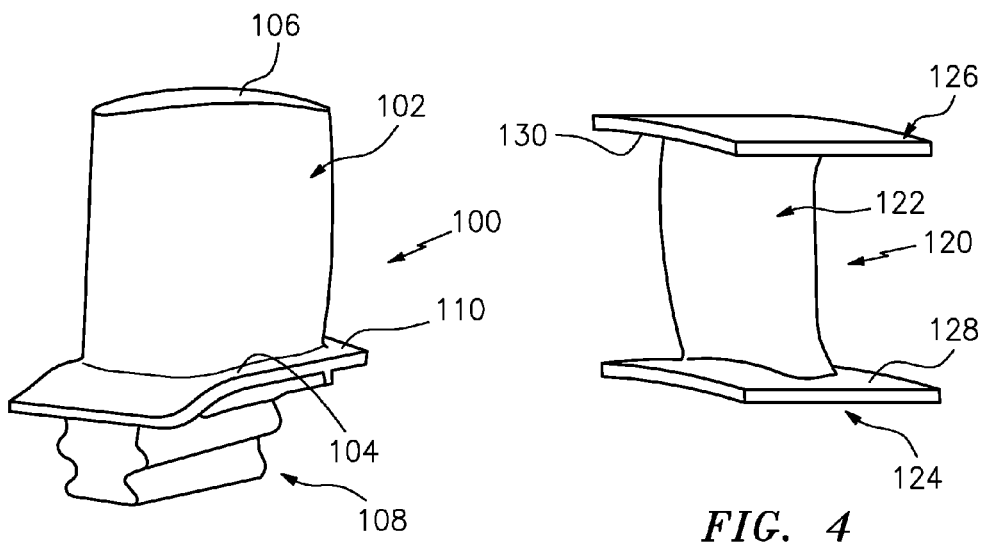
*FIG. 3*  *FIG. 4*

THERMAL BARRIER COATINGS AND METHODS OF APPLICATION

BACKGROUND

The disclosure relates to gas turbine engines. More particularly, the disclosure relates to thermal barrier coating systems.

Gas turbine engine combustor and turbine components are exposed to extreme heat during engine operation. They are also exposed to the mechanical action of the gas flow and to chemical reaction from combustion gas and entrained matter. Exemplary such hot section components include combustor panels, vanes, blades, air seals, and the like. Accordingly, it is customary to coat such components with thermal barrier coating (TBC) systems.

Exemplary thermal barrier coating systems include two-layer thermal barrier coating systems. An exemplary system includes a MCrAlY bond coat (where M identifies one or more of Fe, Ni, and Co) and a yttria-stabilized zirconia (YSZ) thermal barrier coat (TBC). While barrier coat layer is being deposited or during an initial heating cycle, a thermally grown oxide (TGO) layer (e.g., alumina) forms atop the bond coat layer. As time-at-temperature and the number of cycles increase, this TGO interface layer grows in thickness. U.S. Pat. Nos. 4,405,659 and 6,060,177 disclose exemplary systems.

Especially when used in sandy desert environments, engine components are subject to a particular form of fouling/damage known as molten sand attack or CMAS. CMAS is an abbreviation for "calcium-magnesium-aluminum-silicon (silicate)". Specific CMAS oxides include CAO, MGO, $Al_2O_3$, and $SiO_2$. CMAS components may form a eutectic with a relatively low melting point (e.g., approximately 1240 C). The molten CMAS material infiltrates into porous coatings (e.g., between the columns of columnar ceramic). This can alter the chemical composition of the coating and/or cause structural failure of the coating. Efforts to address CMAS have centered on improved barrier coatings. For example, U.S. Pat. Nos. 5,660,885, 5,871,820, 5,914,189, 6,720,038, 6,627,323, 6,465,090, all reference coatings relative to CMAS.

SUMMARY

One aspect of the disclosure involves a coated part for exposure to a gas flow. The gas flow has a characteristic gas flow direction distribution over a surface of the coated part. The coated part has a substrate having a substrate surface and a coating over the substrate surface. The coating comprises at least one coating layer. A first such layer is columnar and has a column boundary direction distribution. The column boundary direction distribution is selected for partial local alignment with the gas flow direction distribution.

The part may be manufactured by: determining or receiving a part configuration; determining or receiving the gas flow direction distribution; from the shape and the gas flow direction distribution, determining an application process associated with the column boundary directions; and applying the coating to provide the column boundary direction distribution. The applying of the coating may comprise applying the layer via a PVD, EB-PVD, or IE-EB-PVD process.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 1 is a schematic sectional view of a coating system on a substrate.

FIG. 2 is a schematic plan/projected view of the surface of the coating system.

FIG. 3 is a simplified view of a blade.

FIG. 4 is a simplified view of a vane.

Like reference numbers and designations in the various drawings indicate like elements.

DETAILED DESCRIPTION

Figure 5:
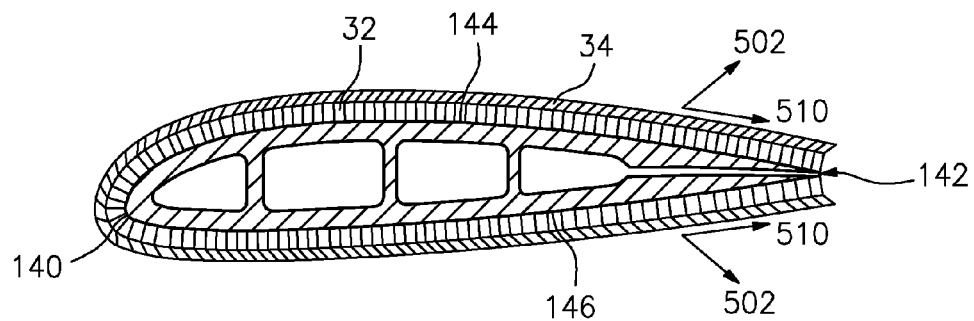
FIG. 5 is a simplified cross-sectional view of an airfoil of a blade or vane.

FIG. 1 shows a coated part 20 comprising a metallic substrate 22 and a coating system 24 atop a surface 26 of the substrate. After any surface preparation of the substrate, an initial deposited layer 28 of the coating system 24 is a bond coat. An exemplary bond coat is an MCrAlY. An alternative bond coat is a diffusion aluminide. With the exemplary coating system, there is a partial diffusion of the bond coat with the substrate in a diffusion zone 30.

After depositing the bond coat, a ceramic TBC is then applied. An exemplary application comprises a base layer 32 and an additional layer 34 outboard thereof. FIG. 1 also shows a TGO layer 38 which, optionally, may grow on the bondcoat. In a first exemplary situation, the layer 34 is an outboardmost layer whose outer/outboard/exterior surface 40 forms the outer/outboard/exterior surface of the coating system and coated article as a whole. As is discussed further below, the outer layer 34 and/or any additional outboardmost layer may be adapted to provide resistance to CMAS infiltration.

In a first exemplary implementation of the coating system 24, the layer 32 and 34 are of like composition to each other (e.g., of exactly the same composition or within standard industry specifications for a given single coating). An exemplary composition is a 7YSZ.

Exemplary application techniques for the layers 32 and 34 include physical vapor deposition (e.g., electron beam physical vapor deposition (EB-PVD) or ion enhanced electron beam physical vapor deposition (IE-EB-PVD)). FIG. 1 shows a local average surface normal 500 for the surface 40. This is effectively coincident with local average surface normals for the surfaces of each of the layers of the coating system and the substrate surface 26. The average is used because local angles may vary due to roughness. The exemplary layers 32 and 34 have columnar microstructure with respective column interfaces/boundaries schematically shown as 50 and 52. These are generally coincident with the growth directions of the coatings. The boundaries may be associated with pores. The transverse pore dimensions may be relatively large near the bondcoat and at the exposed outer surface of any layer. The exemplary growth direction of the individual columns. The exemplary boundaries 50 are approximately normal to the surface (e.g., parallel to the direction 500). This may be achieved by orienting the substrate essentially normal to the vapor flowpath from the vapor source during deposition. The exemplary boundaries 52 are, however, off-normal: extending in a direction 502 off-parallel to 500 by an angle $\theta_1$. FIG. 1 also shows a local direction 510 of the gas flow over the surface 40. An angle $\theta_2$ is between the direction 502 and the direction 510.

FIG. 2 is a plan view of the part showing a projection 502' of the boundary direction 502 and showing the local flow direction 510. An angle $\theta_3$ is between the projection 502' and the direction 510.

In order to limit infiltration into the TBC of contaminants in the gas flow, the boundary direction of the layer 34 may be selected to largely minimize ingestion of CMAS into the interfaces/boundaries 52. This may be achieved by orienting the openings of the boundaries at the surface 40 to face away from the flow. For example, this may orient the direction 502 closer to the local downstream direction defined by the direction 510 rather than to the opposite upstream direction. Thus, the angle $\theta_1$ may be selected to be sufficiently large while the angle $\theta_3$ may be selected to be sufficiently small. Subject to various deposition constraints, it may be sought to bring the direction 502 as close as possible to parallel with the direction 510. To the extent that the distribution of the direction 510 varies across the surface of the part, the distribution of the direction 502 may similarly be varied. This may be achieved by orienting the part during deposition so that the direction 502 is anti-parallel to the direction of flow from the deposition source. During deposition, the part may be progressively reoriented to provide the desired distribution of the direction 502. For example, if the vapor source is non-moving, an actuator such as a 6-axis industrial robot may manipulating the part/substrate during deposition.

The layers 32 and 34 may be formed as during a continuous process (e.g., a continuous IE-EB-PVD process) merely changing the part orientation (or movement path) at the appropriate time to transition or there may be a stoppage or other change between stages of deposition. Ion enhancement reduces intra-columnar TBC porosity and heightens the coating stoichiometry due to higher energies of adatoms (ions) on the coating surface during deposition. To deposit the exemplary YSZ coating in the vapor ionization regime RF power is applied to the inductor; while the bias voltage to the sample is applied from a pulse modulator using a contact device. Exemplary bias voltage is 1.0-2.0 kV, duty cycle is in a range of 0.1-0.7, and pulse frequency is about 2 kHz.

FIG. 1 shows an exemplary overall coating thickness T (not including the diffusion layer 30). Of T, the exemplary bond coat thicknesses is shown as T. Exemplary thickness of the layer 32 is $T_2$ and of layer 34 is $T_3$ for a combined TBC thickness $T_4$. Exemplary TGO thickness $T_5$ may, as the TGO grows, reduce bond coat thicknesses $T_1$ An exemplary angle $\theta_1$ is 30-60°, more narrowly, 35-55° or 40-50° with a nominal 45° value. This may be along a majority of any relevant region. Part shape and plume access may restrict ability to obtain uniformity or other desired distribution. One of the countervailing factors or constraints alluded to above is that higher deposition angles (higher θ) have been identified as leading to higher porosity thereby substantially countering advantages against infiltration. The relationship between angle and porosity is generally discussed in S. Gu et al., "Thermal Conductivity of Zirconia Coatings with Zig-Zag Pore Microstructures", Acta Mater., 49, 2001, pp. 2539-2547 and D. D. Hass et al., "Low Thermal Conductivity Vapor Deposited Zirconia Microstructures", Acta Mater., 49, 2001, pp. 973-983. An exemplary angle $\theta_3$ is less than 90° along any important regions of the part, more narrowly, less than 45° along a majority of any important area (e.g., the surface of an airfoil or the hot surface of a combustor panel), more narrowly, less than 30° or less than 20°.

Exemplary T is 300-1,000 micrometer, more narrowly, 500-700 micrometer. Exemplary $T_2$ is 200-1,000 micrometer, more narrowly, 300-500 micrometer. Exemplary $T_3$ is at least 5 micrometer, more narrowly, 5-200 micrometer, or 10-50 micrometer. An exemplary ratio of $T_2$ to $T_3$ is 1:1-5:1, more narrowly, 2:1-3:1.

A first example of a situation where this may be put into practice is of a part having an airfoil (e.g., a blade or vane of a turbine section). FIG. 3 shows a blade 100 having an airfoil 102 extending from a proximal end at a platform 104 to a distal end or tip 106. The platform has an outboard (gas path-facing surface 110). An attachment root 108 depends from the underside of the platform 104.

FIG. 4 shows a vane 120 having an airfoil 122 extending from an inboard end at an inboard platform or shroud 124 to an outboard end at an outboard platform or shroud 126. The inboard platform 124 has an outer surface (gas path-facing surface) 128 while the shroud 126 has an inboard surface (gas path-facing surface) 130.

FIG. 5 shows the airfoil of either the blade or vane. The airfoil has a leading edge 140 and a trailing edge 142. The airfoil has a suction side or surface 144 and a pressure side or surface 146. Along the airflow, the direction 510 is the local streamwise direction which, along each side extends from the leading edge toward the trailing edge. FIG. 5 also schematically shows boundary directions of the two TBC layers (thickness exaggerated). The respective directions 502 are selected to provide the desired relationship to the directions 510 discussed above.

Figure 7:
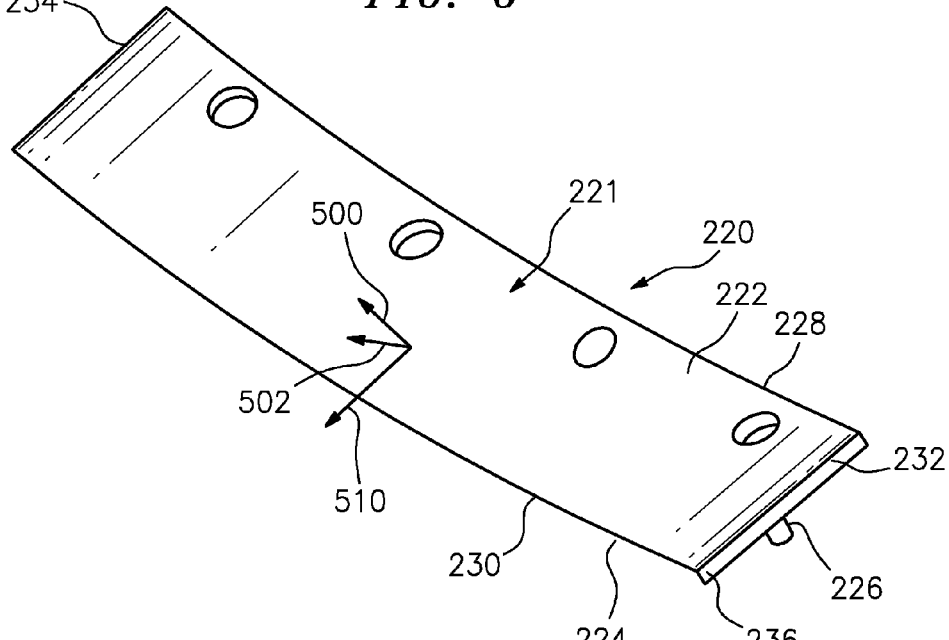
FIG. 7 is a simplified view of a combustor panel.

Among other part/component variations, the substrate may be a substrate of a combustor panel (e.g., a floatwall panel). An exemplary floatwall panel has a gas path-facing surface formed as a frustoconical segment. An exemplary combustor is formed by a number of concentric inner rings and outer rings of such panels. The flow direction 510 along each such panel may be generally from an upstream edge to a downstream edge. The boundary angle may be oriented accordingly with similar relationships to those described above. FIG. 7 shows a turbine engine combustor panel 220 which may be formed having a body 221 shaped as a generally frustoconical segment having inboard and outboard surfaces 222 and 224. The exemplary panel is configured for use in an annular combustor circumscribing the engine centerline. In the exemplary panel, the inboard surface 222 forms an interior surface (i.e., facing the combustor interior) so that the panel is an outboard panel. For an inboard panel, the inboard surface would be the exterior surface. Accordingly, mounting features such as studs 226 extend from the outboard surface for securing the panel relative to the engine. The exemplary panel further includes an upstream/leading edge 228, a downstream/trailing edge 230 and lateral edges 232 and 234. Along the edges or elsewhere, the panel may include rails or standoffs 236 extending from the exterior surface 224 for engaging a combustor shell (not shown). The exemplary panel includes a circumferential array of large apertures for the introduction of process air. Smaller apertures (not shown) may be provided for film cooling. Moreover, select panels may accommodate other openings for spark plug or igniter placement.

Among further process/composition variations, the outer layer may be formed by a modified process. One modified process involves applying the outer layer via ion enhanced electron beam physical vapor deposition (IE-EB-PVD) whereas the layer 32 may be applied via mere EB-PVD. For example, the inner layer 32 may be deposited optionally by standard EB-PVD or ion enhanced EB-PVD technique, while ion enhancement application may be preferred during the whole process of forming the outer layer 34 in order to reduce excessive porosity appearing due to inclined deposition.

Additional variations involve post-deposition treatment. A first post-deposition treatment involves a mechanical smoothing (e.g., burnishing or machining) to reduce roughness. By reducing roughness, the chances of trapping contaminants is reduced. Also, wettability by molten CMAS may be reduced by the associated smoothing. An exemplary burnishing involves diamond, roller burnishing, and the like. An exemplary machining involves mechanical grinding/polishing with media such as grinding paper, diamond paste, Al and Cr oxides, and the like. As applied coating thickness may be sufficient to leave post-smoothing $T_3$ in the ranges noted above.

Figure 6:
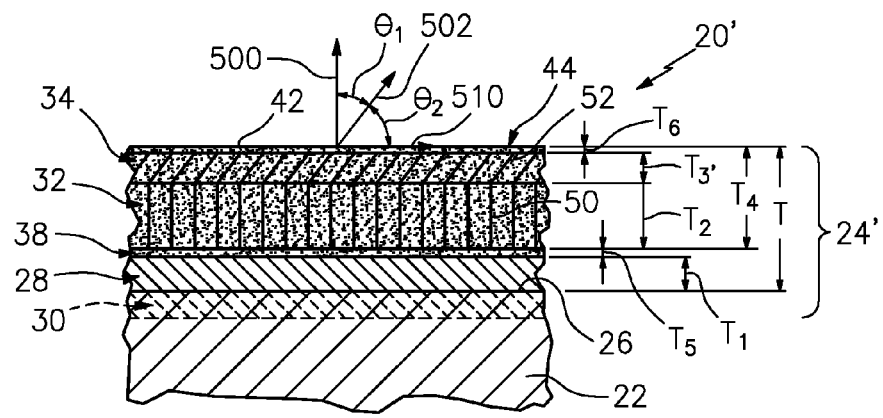
FIG. 6 is a schematic sectional view of a second coating system on a substrate.

Another surface treatment involves a post-deposition rastering with an energy source (e.g., ion beam, electron beam, or laser beam) to achieve a degree of melting or remelting to smooth and seal the exposed surface. FIG. 6 shows a coated part 20' comprising a metallic substrate 22 and a coating system 24' atop a surface 26 of the substrate. Otherwise similar to the part 20, and system 24, FIG. 6 shows a remelt zone/layer 42 as an outboardmost layer whose outer/outboard/exterior surface 44 forms the outer/outboard/exterior surface of the coated article as a whole.

An exemplary remelting involves leaving a remelt depth $T_6$ of 2-20 micrometer, more narrowly, about 3-8 micrometer or 5 micrometer. This leaves the layer 34 with a thickness $T_3'$ which may be the same as $T_3$ post machining from the prior embodiment. In addition to increasing resistance to the chemical and mechanical working (expansion and/or contraction) components of CMAS attack, the remelt may further increase generic erosion resistance by hardening and smoothing. Remelt can obliterate the separation between columns, at least partially, so as to make molten CMAS infiltration between the columns more difficult. Remelting is expected also to considerably increase hardness of the surface layer, and so to improve TBC erosion resistance Milling/machining (grinding, polishing) is used with the goal of smoothing the TBC surface, so the thickness of removed ceramic depends on the as-deposited surface roughness. Remelted layer thickness is dictated, on the one hand, to be sufficiently thick to provide effect (e.g., several micrometers at least); and, on the other hand, to be sufficiently thin to avoid a noticeable deterioration in thermal stress relaxation performance of EB-PVD ceramics (e.g., not thicker than 25-30 micrometers to avoid undesirably reducing tolerance to thermal stresses).

A manufacturing process for the part may involve determining or receiving a part configuration. For example a solid model data file for an existing part may be received. The gas flow direction distribution may be determined or received (e.g., via experimental flow measurement, via observation of wear on an existing part, and/or via computational fluid/combustion dynamics modeling). From the shape and the gas flow direction distribution, an application process associated with the column boundary directions may be determined. This may be experimentally determined to best approach alignment with the flow directions in view of any limitations associated with the deposition equipment to be used and/or part geometry. The coating may be applied to provide the column boundary direction distribution.

Although an embodiment is described above in detail, such description is not intended for limiting the scope of the present disclosure. It will be understood that various modifications may be made without departing from the spirit and scope of the disclosure. For example, when modifying a baseline part and/or baseline coating system, details of the existing part and system may influence details of any particular implementation. Accordingly, other embodiments are within the scope of the following claims.

What is claimed is:

1. A coated part for exposure to a gas flow having a characteristic gas flow direction (510) distribution over a surface of the coated part, the coated part comprising:
a substrate (22) having a substrate surface (26);
a coating (24) over the substrate surface and comprising at least one coating layer, a first said layer (52) being columnar and having a column boundary direction (502) distribution, the column boundary direction distribution selected for partial local alignment with the gas flow direction distribution; and
an airfoil portion having a leading edge (140), a trailing edge (142), a pressure side (144) and a suction side (146),
wherein:
along the respective pressure side and suction side, respective streamwise directions (510) extend from the leading edge toward the trailing edge; and
a projection (502') of the column boundary direction along the surface of the coated part is at an angle ($\theta_3$) within 45° of the streamwise direction on majorities of both said pressure side and said suction side.

2. The part of claim 1 wherein:
along at least a portion of the part, the first layer has a thickness of 10-50 micrometer.

3. The part of claim 1 wherein:
along at least a portion of the part, the first layer comprises at least 10% of a local total coating thickness.

4. The part of claim 1 wherein:
along at least a portion of the part, the first layer forms a majority of a local total coating thickness.

5. The part of claim 1 wherein:
the first layer comprises a YSZ.

6. The part of claim 1 wherein:
the first layer is atop a second layer of like composition to the first layer; and
the second layer less aligned with the flow direction distribution than the first layer is aligned with the flow direction distribution.

7. The part of claim 6 wherein:
along at least a portion of the part, a combined thickness of the first layer and second layer is at least 75% of a total coating thickness.

8. The part of claim 1 wherein:
along at least a portion of the part, the first layer is an outermost layer.

9. The part of claim 1 wherein the coating further comprises:
an additional layer atop the first layer and characterized by at least one of:
a remelted microstructure; and
a milled microstructure.

10. The coated part of claim 1 wherein:
along a majority of said surface a second angle ($\theta_1$) between the columnar boundary direction and the surface normal is 35-55°.

11. The part of claim 6 wherein the first layer and second layer are ceramic layers.

12. The part of claim 11 wherein the first layer and second layer comprise a YSZ.

13. The part of claim 1 wherein the coating further comprises:
a layer (42) outboard of said first layer (52) and having a remelted microstructure.

14. A coated part for exposure to a gas flow having a characteristic gas flow direction (510) distribution over a surface of the coated part, the coated part comprising:
a substrate (22) having a substrate surface (26); and
a coating (24) over the substrate surface and comprising at least one coating layer, a first said layer (52) being columnar and having a column boundary direction (502) distribution, the column boundary direction distribution selected for partial local alignment with the gas flow direction distribution, the part being a combustor panel in an annular combustor of a gas turbine engine and wherein, along a majority of a hot side of the panel, an angle (θ₃) between the downstream direction and a projection (502') of the column boundary direction is within 30° and the columnar direction distribution is more than 30° off-normal to a surface of said hot side.

15. A method for manufacturing the part of claim 1 comprising:
  determining or receiving a part configuration;
  determining or receiving the gas flow direction distribution;
  from the shape and the gas flow direction distribution, determining an application process associated with the column boundary directions; and
  applying the coating to provide the column boundary direction distribution.

16. The method of claim 15 wherein:
  the applying of the coating comprises applying the layer via a PVD, EB-PVD, or IE-EB-PVD process.

17. A coated part comprising:
  a substrate (22) having a substrate surface (26); and
  a coating (24) over the substrate surface and comprising:
    a first coating layer (52) being columnar and having a column boundary direction (502) distribution, the column boundary direction distribution in partial local alignment with a gas flow direction distribution, wherein:
    the surface is a surface of an airfoil or a hot surface of a combustor panel;
    a first angle (θ₃) between the gas flow direction 510 and a projection (502') of the column boundary direction along the surface of the coated part is within 45° along a majority of said surface; and
    along a majority of said surface a second angle (θ₁) between the columnar boundary direction and a surface normal is 35-55°.

18. The part of claim 17 being a combustor panel in an annular combustor of a gas turbine engine and wherein, along a majority of said hot surface, the second angle is 35-50° and the first angle is less than 20°.

19. The method of claim 15 further comprising:
  after applying the coating, milling a surface of the coating to smooth the surface.

20. The method of claim 15 further comprising:
  after applying the coating, melting or remelting a surface layer of the coating.

* * * * *